(12) United States Patent  
Mori et al.

(10) Patent No.: US 6,714,888 B2
(45) Date of Patent: Mar. 30, 2004

(54) APPARATUS FOR TESTING SEMICONDUCTOR INTEGRATED CIRCUIT

(75) Inventors: Hisaya Mori, Hyogo (JP); Shinji Yamada, Hyogo (JP); Teruhiko Funakura, Tokyo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 278 days.

(21) Appl. No.: 09/927,470

(22) Filed: Aug. 13, 2001

(65) Prior Publication Data

US 2002/0107654 A1 Aug. 8, 2002

(30) Foreign Application Priority Data

Feb. 8, 2001 (JP) ........................................ 2001-032851

(51) Int. Cl.[7] .............................................. G01R 31/00
(52) U.S. Cl. ...................................... 702/120; 324/755
(58) Field of Search .......................... 702/120, 58, 59, 702/108, 117, 118, 124, 126, 183, 185, 189; 324/158.1, 754–765; 714/724–734

(56) References Cited

U.S. PATENT DOCUMENTS

| | | | | |
|---|---|---|---|---|
| 4,285,059 A | * | 8/1981 | Burlage et al. ............. 714/736 |
| 4,797,808 A | * | 1/1989 | Bellay et al. .................. 714/30 |
| 4,942,576 A | * | 7/1990 | Busack et al. ............... 714/719 |
| 5,063,383 A | * | 11/1991 | Bobba .......................... 341/120 |
| 5,517,192 A | * | 5/1996 | Masarik et al. ............. 341/139 |
| 5,559,440 A | * | 9/1996 | Lopresti et al. ............. 324/607 |
| 5,583,502 A | * | 12/1996 | Takeuchi et al. ............ 341/120 |
| 5,854,598 A | * | 12/1998 | De Vries et al. ............ 341/120 |
| 5,977,774 A | * | 11/1999 | Noble et al. ................. 324/523 |
| 6,408,412 B1 | * | 6/2002 | Rajsuman .................... 714/724 |
| 6,449,741 B1 | * | 9/2002 | Organ et al. ................. 714/724 |

FOREIGN PATENT DOCUMENTS

| | | |
|---|---|---|
| JP | 08-233912 | 9/1996 |
| JP | 09-189750 | 7/1997 |

* cited by examiner

*Primary Examiner*—Marc S. Hoff
*Assistant Examiner*—Mohamed Charioui
(74) *Attorney, Agent, or Firm*—McDermott, Will & Emery

(57) ABSTRACT

There is provided an apparatus and method of testing a semiconductor integrated circuit, which apparatus and method enable testing of various semiconductor integrated circuits having different characteristics, fulfillment of the function of generating DAC data, and adaptation of various analog characteristic tests. An input range of a BOST device is switchable in accordance with the level of a DAC of a DUT, so that the test apparatus can handle DUTs of different types having different analog output levels.

7 Claims, 7 Drawing Sheets

APPARATUS FOR TESTING SEMICONDUCTOR INTEGRATED CIRCUIT

BACKGROUND OF THE INVENTION

1. Field of the Invention

The present invention relates to an apparatus and method for testing a semiconductor integrated circuit, and more particularly to an apparatus for testing a semiconductor integrated circuit including an A/D (analog-to-digital) converter circuit for converting an analog signal into a digital signal and a D/A (digital-to-analog) converter circuit for converting a digital signal into an analog signal.

2. Background Art

Recently, in relation to a system LSI embodied in a one-chip semiconductor integrated circuit (a one-chip LSI) consisting of a plurality of functionally-systematized circuit modules or embodied in a hybrid integrated circuit (a chip set LSI), combination of high performance and precision digital and analog circuits (i.e., a system LSI handling a mixed signal) has been rapidly pursued. Even in relation to a test apparatus for use with a semiconductor integrated circuit, development of a test apparatus capable of handling a mixed signal is also pursued. Tester manufacturers have provided testers coping with a semiconductor integrated circuit using a mixed signal.

A tester compatible with a semiconductor integrated circuit using a mixed signal has a tendency to become expensive in order to comply with high performance specifications. For this reason, moves are afoot to recycle an existing low-speed, low-precision tester which has been used for, e.g., a logic LSI, to thereby avoid a hike in the price of a tester.

A big problem with such a test apparatus lies in a characteristic test for a D/A converter circuit for converting a digital signal into an analog signal (digital-to-analog converter, hereinafter called a "DAC") as well as in a characteristic test for an A/D converter circuit for converting an analog signal into a digital signal (hereinafter called an "ADC"). In association with an increase in the precision of the characteristic test, embodiment of a low-cost test apparatus compatible with a semiconductor integrated circuit including the DAC and ADC has posed a challenge.

In a testing environment of a general tester, a plurality of DUT (device under test) circuit boards (simply called "DUT boards") and connection jigs for connecting a tester with a DUT, such as cables, are provided at arbitrary points along a measurement path extending from measurement equipment provided in the tester to a semiconductor integrated circuit under test (hereinafter called a "DUT"). Further, the measurement path is long and accounts for occurrence of noise and a drop in measurement accuracy. Further, simultaneous testing of a plurality of DUTs is also impossible. A limitation is imposed on the speed of a low-speed tester, and hence the low-speed tester cannot conduct a test at a real operating speed, thereby posing a fear of an increase in a time required for conducting mass-production testing of a system LSI.

Japanese Patent Application Laid-Open No. 316024/1989 describes a tester. The tester is equipped with a memory device for storing conversion data at an address designated by input data which have been entered into a DAC of a test circuit. An analog signal which has been subjected to digital-to-analog conversion is input to an ADC, and an output from the ADC is sequentially stored in the memory device. After conversion of all the input data sets has been completed, the conversion data stored in the memory device are sequentially delivered to a tester. The tester sequentially compares the input data with the conversion data, thus producing a test conclusion.

However, the tester must supply data to be input to the DAC, an address to be used for storing conversion data into a memory device, and a control signal. Moreover, data stored in the memory device must be supplied to the tester. Further, there is the probability that noise arising in a long measurement path extending from the tester to a DUT may deteriorate precision of measurement. Further, the majority of pin electronics provided on the tester are occupied for testing a single DUT, thereby posing a difficulty in simultaneous measurement of a plurality of DUTs.

Further, communication for transmitting conversion data to the tester is time consuming, and test conclusions are produced after completion of all tests. Hence, shortening of a test time is also difficult.

SUMMARY OF THE INVENTION

The present invention has been conceived to solve such a problem and is aimed at providing an apparatus and method of testing a semiconductor integrated circuit, which apparatus and method enable testing of various semiconductor integrated circuits having different characteristics, fulfillment of the function of generating DAC data, and adaptation of various analog characteristic tests.

According to one aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and an external controller connected to the test ancillary device. The test ancillary device comprises a data circuit which produces a digital test signal and supplies the digital test signal to the D/A converter circuit of the semiconductor integrated circuit to be tested, a testing D/A converter circuit which converts the digital test signal from the data circuit into an analog test signal and supplies the analog test signal to the A/D converter circuit of the semiconductor integrated circuit to be tested, a register circuit which is provided in the data circuit and is arranged so as to be able to change the number of bits of digital input of the D/A converter circuit of the semiconductor integrated circuit to be tested and the number of bits of digital input of the testing D/A converter circuit matching the measurement resolution of the A/D converter circuit of the semiconductor integrated circuit to be tested, a testing A/D converter circuit which converts an analog test output from the D/A converter circuit of the semiconductor integrated circuit to be tested into a digital test output, measured data memory for storing a digital test output from the A/D converter circuit of the semiconductor integrated circuit to be tested and the digital test output from the testing A/D converter circuit, and an analysis section for analyzing the each digital test outputs stored in the measured data memory, The digital test signal and the analog test signal are imparted to the semiconductor integrated circuit to be tested in accordance with an instruction from the external controller, and a result of analysis of the each digital test outputs stored in the measured data memory, the analysis being performed by the analysis section, is sent to the external controller.

According to another aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and a tester connected to the test ancillary device. The test ancillary device comprises look-up memory which stores required data beforehand, outputs data by sequentially updating an output from a memory address counter for supplying an address of the required data, and supplies the data as a digital test signal to the D/A converter circuit of the semiconductor integrated circuit to be tested, a testing D/A converter circuit which converts the digital test signal output from the look-up memory into an analog test signal and supplies the analog test signal to the A/D converter circuit of the semiconductor integrated circuit to be tested, a testing A/D converter circuit which converts an analog test output from the D/A converter circuit of the semiconductor integrated circuit to be tested into a digital test output, measured data memory for storing a digital test output from the A/D converter circuit of the semiconductor integrated circuit to be tested and the digital test output from the testing A/D converter circuit, and an analysis section for analyzing the each digital test outputs stored in the measured data memory. The digital test signal and the analog test signal are imparted to the semiconductor integrated circuit to be tested in accordance with an instruction from the tester, and a result of analysis of the each digital test outputs stored in the measured data memory, the analysis being performed by the analysis section, is sent to the tester.

According to another aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and a tester connected to the test ancillary device. The test ancillary device comprises an analysis section which produces a digital test signal by an arithmetic function and supplies the digital test signal to the D/A converter circuit of the semiconductor integrated circuit to be tested, a testing D/A converter circuit which converts the digital test signal output from the analysis section into an analog test signal and supplies the analog test signal to the A/D converter circuit of the semiconductor integrated circuit to be tested, a testing A/D converter circuit which converts an analog test output from the D/A converter circuit of the semiconductor integrated circuit to be tested into a digital test output, and measured data memory for storing a digital test output from the A/D converter circuit of the semiconductor integrated circuit to be tested and a digital test output from the testing A/D converter circuit. The analysis section analyzes the each digital test outputs stored in the measured data memory.

According to another aspect of the present invention, there is provided a test method for testing a semiconductor integrated circuit, in which a test is conducted through use of one of the test apparatuses as described above.

A test apparatus and method according to the present invention enables switching of a range in accordance with the level of an output from a DAC for test purpose provided in a BOST device or with the level of an output from the DAC during an analog test. Hence, the test apparatus and method can be applied to measurement of DUTs of different types which have different analog output voltage levels or analog input voltage levels.

According to the test apparatus and method according to the present invention, required data which have been computed beforehand are stored in lookup memory, and a memory address counter which supplies an address of the lookup memory is updated sequentially, so that data are output from the memory address counter. The thus-output data are set as a digital test signal. By means of storing, into memory, a required number of DAC input data sets which take into consideration the number of bits and repetitions required by the DAC, measurement of analog circuits of different types can be effected. Thus, the test apparatus and method can cope with evaluation of design of an analog circuit and adaptation to a variety of analog characteristic tests.

Other and further objects, features and advantages of the invention will appear more fully from the following description.

DETAILED DESCRIPTION OF THE PREFERRED EMBODIMENTS

First Embodiment

A first embodiment of the present invention will now be described by reference to a drawing.

Figure 8:
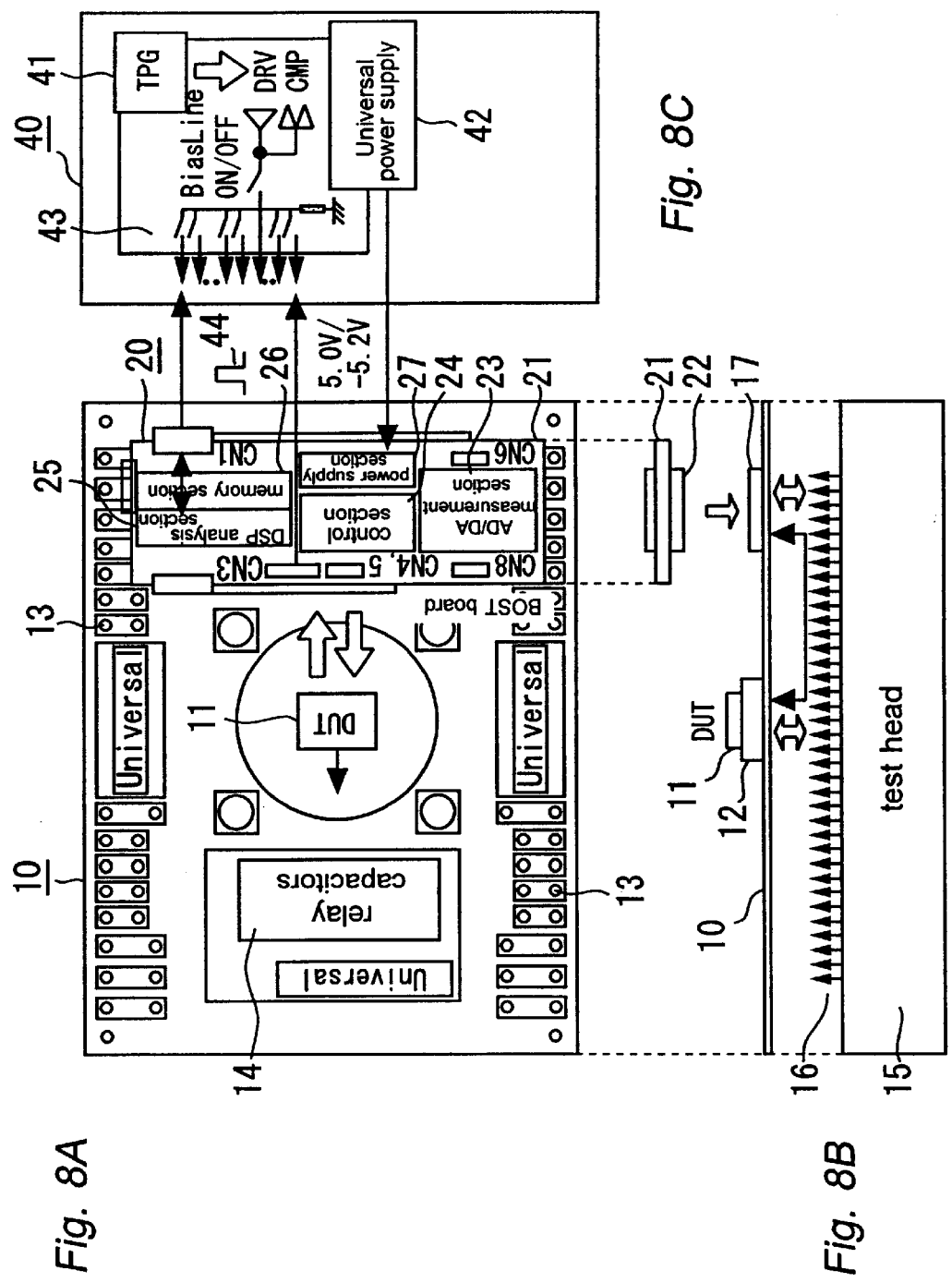
FIGS. 8A through 8C are schematic diagrams showing the configuration of an improved test apparatus for testing a semiconductor integrated circuit embodying this invention.

FIGS. 8A through 8C are schematic diagrams showing the configuration of a test apparatus for testing a semiconductor integrated circuit embodying this invention.

FIG. 8A is a top view of a DUT board; FIG. 8B is a side view of the DUT board; and FIG. 8C is a schematic diagram showing the configuration of a test machine (tester).

The test apparatus comprises a DUT board 10; a test ancillary device (also called a BOST (built-off self-test) device)) 20; and a tester 40.

The DUT board 10 is designed for testing a molded IC designated by a DUT 11. A molded IC is a semiconductor integrated circuit (IC) chip which is coated with mold resin such that a plurality of terminals are led outside from the mold resin. The IC chip mounted on the DUT 11 is, for example, a one-chip system LSI of mixed signal type. A DAC for converting a digital signal into an analog signal and an ADC for converting an analog signal into a digital signal are provided within a single chip. A hybrid integrated circuit (IC) of mixed signal type comprising a plurality of chips mounted on a common circuit board may be employed as the DUT 11.

The DUT board 10 has a DUT socket 12 for receiving terminals of the DUT 11. A plurality of connection terminals 13 and a cluster of relay capacitors 14 for test purposes are provided around the DUT socket 12.

As shown in FIG. 8B, a test head 15 is located below the DUT board 10. The test head 15 has a plurality of connection pins 16 to be connected to the DUT board 10. Signals required for a test are exchanged with the DUT 11 by way of the connection pins 16.

A BOST device 20 is provided in the vicinity of the DUT board 10. In the example of the circuit shown in FIG. 8, the BOST device 20 is constituted on a test ancillary board (BOST board) 21. The BOST board 21 is to be mounted on the DUT board 10. A socket 17 is provided on the DUT board 10 for receiving the BOST board 21. A connector 22 to be fitted to the socket 17 is provided on a lower surface of the BOST board 21, and the connector 22 is fitted to the socket 17. As a result, the BOST board 21 is supported on the DUT board 10, so that signals are exchanged with the test head 15 by way of the socket 17.

As has been known well, the BOST board 21 is an external test ancillary device (built-off self-test device) for assisting a test circuit which causes a DUT to perform a built-in-self-test therein without having dependence on the tester 40. The BOST board 21 has an AD/DA measurement section 23, a control section 24, a DSP analysis section 25, a memory section 26, and a power supply section 27.

The tester 40 has a test pattern generator (hereinafter simply called a "TPG") 41, a power supply section 42, and a pin electronic section 43. The tester 40 supplies a supply voltage Vd to the BOST board 21, thus exchanging control signals 44 with the BOST board 21. The control signals 44 include a test analysis result signal sent from the BOST board 21 to the tester 40 as well as instruction signals sent from the tester 40 to the BOST board 21 and to the DUT board 10.

The control signals 44, which include a number code (a test analysis number code) and are output from the tester 40 to the BOST board 21, are produced as test pattern signals by the TPG 41 built in the tester 40 in compliance with test signal requirements described in a test program, as in the case of a test conducted on another DUT 11. The control signals 44 are supplied to the BOST board 21 and the DUT board 10, by way of the pin electronic section 43 of the tester 40 having a plurality of signal I/O pins. A test analysis result (pass/fail information) output from the BOST board 21 is delivered to the pin electronic section 43 of the tester 40. A determination section of the pin electronic section 43 acquires information about the test analysis result in comparison with a test pattern signal and through analysis of a comparison result.

Figure 9:
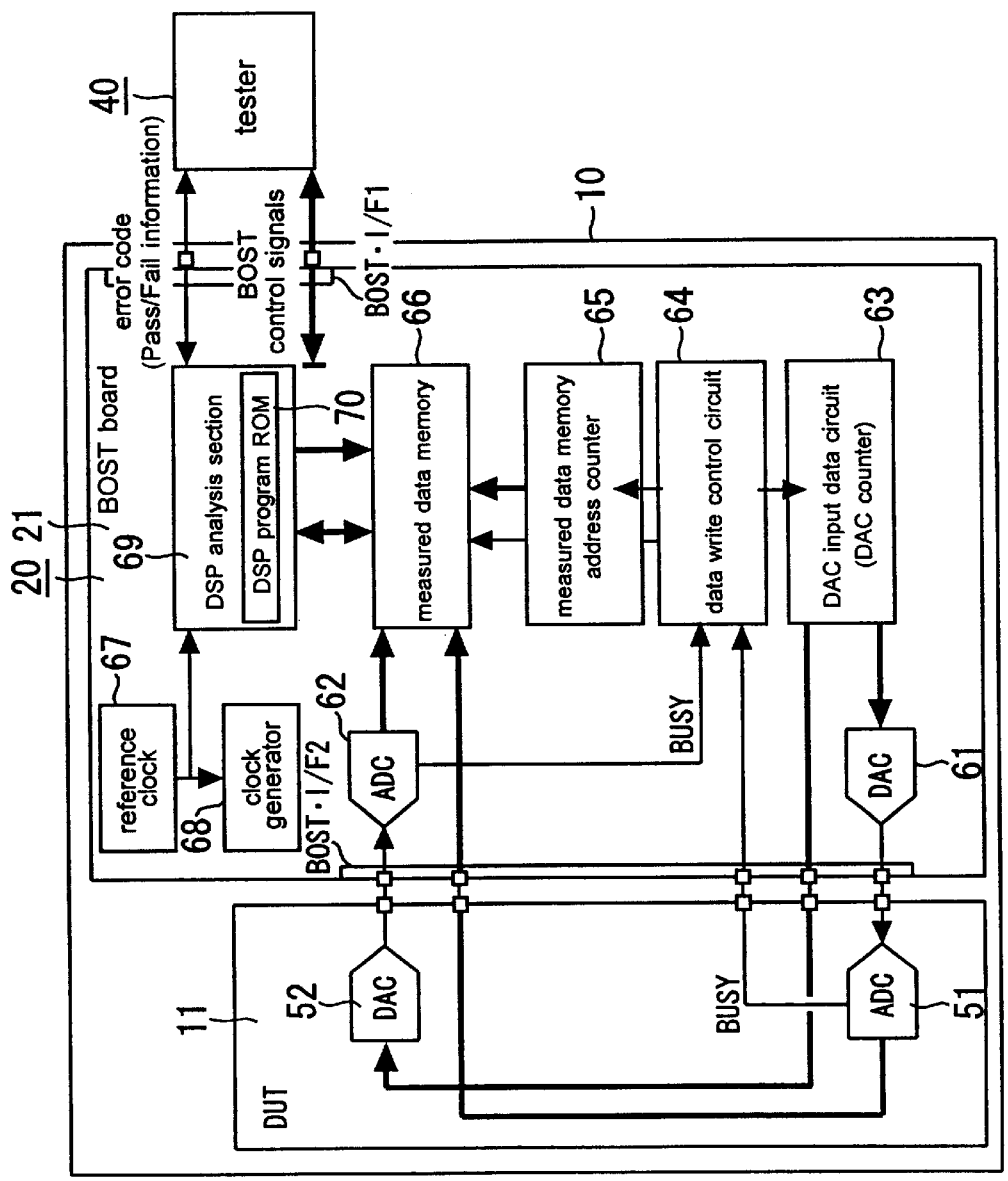
FIG. 9 is a block diagram showing the configuration of an electric circuit provided in the test apparatus shown in FIGS. 8A through 8C.

FIG. 9 is a block diagram showing the configuration of an electric circuit provided in the test apparatus shown in FIGS. 8A through 8C.

The DUT 11 comprises an ADC 51 for converting an analog signal into a digital signal, and a DAC 52 for converting a digital signal into an analog signal.

The BOST board 21 has a testing DAC 61 for test purpose which supplies an analog test signal to the ADC 51 of the DUT 11, and a testing ADC 62 for test purpose which converts an analog test output produced by the DAC 52 of the DUT 11 into a digital test output. Moreover, the BOST board 21 comprises a DAC input data circuit (DAC counter) 63; a data write control circuit 64; a measured data memory address counter 65; measured data memory 66; a reference clock signal circuit 67; a clock signal generator circuit 68; and a DSP analysis section 69. The DSP analysis section 69 has DSP program ROM 70.

The DAC 61, the ADC 62, the DAC input data circuit 63, the data write control circuit 64, and the measured data memory address counter 65 are included in the AD/DA measurement section 23 shown in FIGS. 8A through 8C. The measured data memory 66 is included in the memory section 26, and the DSP analysis section 69 is included in the DSP analysis section 25.

By means of such a configuration, a digital test signal (i.e., test data) is stored in the DAC input data circuit 63. In accordance with an instruction from the tester 40, the test data are supplied from the DAC input data circuit 63 to the DAC 52 of the DUT 11 and to the DAC 61 of the BOST board 21.

The test data supplied to the DAC 61 are converted into an analog test signal, and the analog test signal is supplied to the ADC 51. The ADC 51 converts the analog test signal into a digital test output, and the digital test output is supplied to the measured data memory 66.

Meanwhile, the test data which have been supplied directly to the DAC 52 of the DUT 11 from the DAC input data circuit 63 are converted into an analog test output by the DAC 52. The analog test output is converted into a digital test output by means of the ADC 62 of the BOST board 21. The digital test output is supplied to the measured data memory 66.

The measured data memory 66 sequentially stores to predetermined addresses the digital test output supplied from the ADC 51 of the DUT 11, and the digital test output supplied from the DAC 52 by way of the ADC 62.

The ADC 51 of the DUT 11 and the ADC 62 of the BOST board 21 convert an analog signal into a digital signal, sequentially. Every time a single digital signal is output, the ADC 51 and the ADC 62 each output a BUSY signal. The BUSY signals are supplied to the data write control circuit 64 provided on the BOST board 21. On the basis of the thus-supplied BUSY signals, the datawrite control circuit 64 sequentially advances the digital test data pertaining to the DAC input data circuit 63 to the next digital test data on a per-data-set basis. Further, the data write control circuit 64 acts on the measured data memory address counter 65 so as to sequentially advance an address of the measured data memory 66.

As mentioned above, a code of the digital test data to be converted by the DUT 11 is advanced by the DAC input data circuit 63. As a result of sequential advancement of an address on the measured data memory 66 at which the digital test output converted by the DUT 11 is to be stored, the ADC 51 and the DAC 52 provided in the DUT 11 sequentially pursue conversion required by a test. The thus-converted measured data are sequentially stored in the measured data memory 66. In subsequent processes, conversion tests proceed until a final code set by the DSP analysis section 69 on the BOST board 21 is achieved, and the results of all conversion tests are stored in the measured data memory 66.

After the ADC 51 and the DAC 52 of the DUT 11 have completed conversion tests, the DSP analysis section 69 provided on the BOST board 21 sequentially reads conversion data stored in the measured data memory 66, through use of a program stored in the DPG program ROM 70, thus analyzing a conversion characteristic. The analysis includes computation of an A/D conversion characteristic parameter, a D/A conversion characteristic parameter, a differential linearity, and an integral linearity error. An analysis result (pass/fail information) is sent from the BOST board 21 to the tester 40, wherein the tester 40 processes a test result.

In the configuration shown in FIGS. 8A through 8C, the BOST board 21 is provided in the vicinity of the DUT board 10 and has the function of causing the ADC 51 and DAC 52 of the DUT 11 to perform conversion tests. The conversion tests can be effected on the BOST board 21.

Consequently, an analog measurement system line provided between the DUT board 10 and the BOST board 21 can be shortened, and occurrence of a measurement error attributable to noise can be suppressed sufficiently. Thus, a high-precision test can be implemented, and a test can be carried out at a higher speed on the basis of a signal exchanged between the DUT board 10 and the BOST board 21 located in the vicinity thereof.

An analog measurement system line can be obviated from an area between the BOST board 21 and the tester 40, thereby increasing the accuracy of a test. After required conversion tests have been completed on the BOST board 21, the results of conversion tests are sent to the tester 40. Thus, a test speed can be increased as compared with a case in which converted data are transmitted to the tester 40.

In the apparatus shown in FIGS. 8A through 8C, the conversion test function of the ADC 51 and that of the DAC 52 of the DUT 11 are implemented on the BOST board 21. Hence, there is no necessity of adding a powerful conversion test function to the tester 40. Hence, an increase in the cost of the tester 40 is prevented, thereby enabling diversion of a conventional low-speed tester to the test apparatus. When a tester 40 having a special measurement function is to be manufactured, limitations are imposed on expansion of capabilities of hardware configuration of a tester. Further, manufacture of such a tester 40 involves modifications to the tester itself, posing a fear of a hike in development costs.

The test apparatus shown in FIGS. 8A through 8C utilizes as standard equipment a TPG and pin electronics provided on a common tester. Configuration and control of a BOST board can be effected without being influenced by specifications of testers or restrictions. Thus, application of the test apparatus to various types of testers is feasible.

Figure 1:
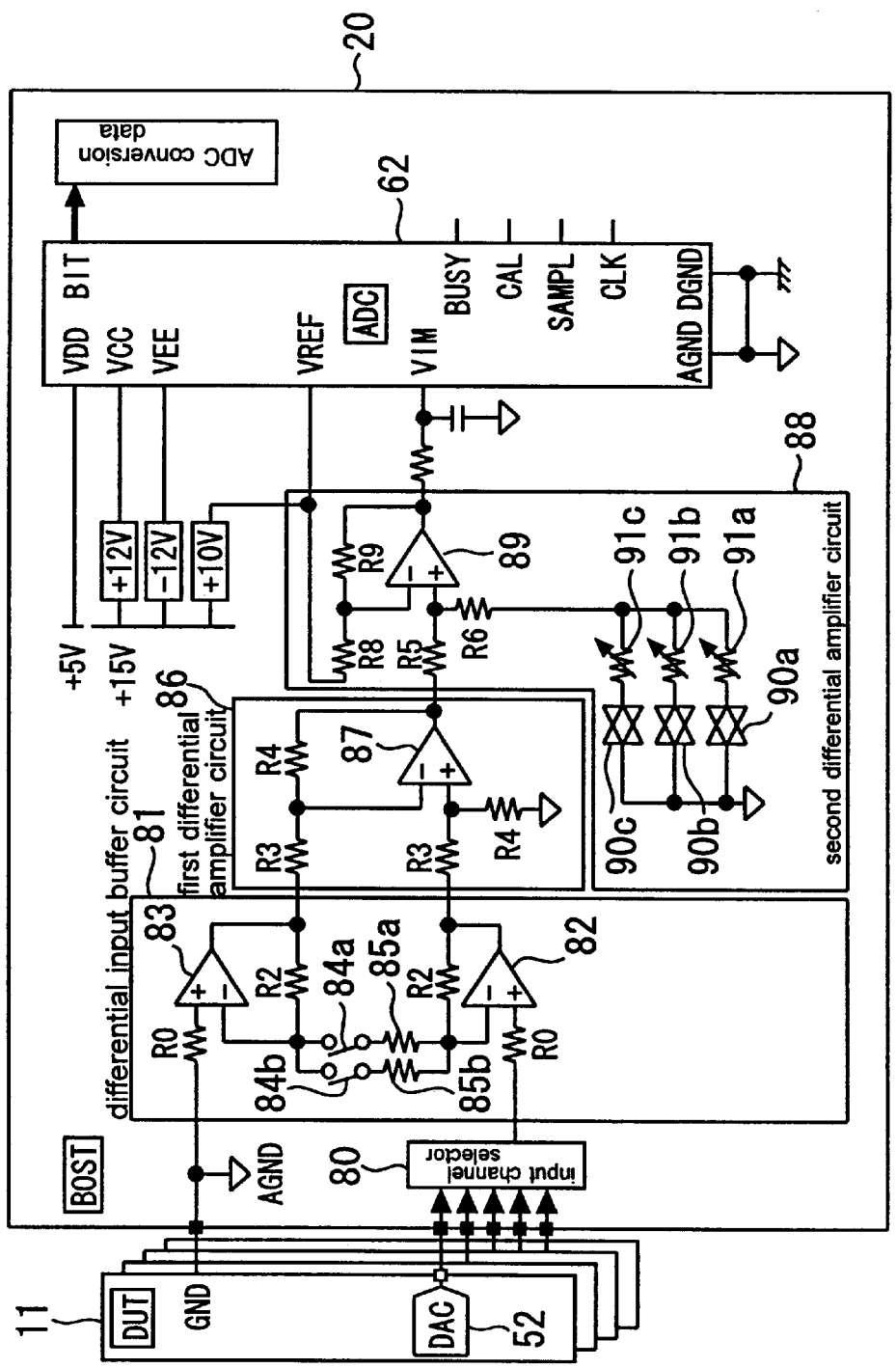
FIG. 1 is a schematic diagram showing the configuration of a test apparatus and a test method according to the first embodiment.

FIG. 1 is a schematic diagram showing the configuration of a test apparatus and a test method according to the first embodiment. In other respects, the test apparatus shown in FIG. 1 is identical in configuration with that shown in FIGS. 8 and 9, exclusive of DUTs 11 and a BOST device 20. Hence, these drawings are employed, and repeated explanation of the test apparatus is omitted.

As shown in FIG. 1, reference numeral 11 designates DUTs. The schematic diagram shows a test apparatus to which a plurality of DUTs having different characteristics are connected simultaneously. Reference numeral 52 designates a DAC provided in each of the DUTs 11, and an ADC to be provided in each of the DUTs 11 is omitted from the drawing. Reference numeral 20 designates a BOST device; and 80 designates an input channel selector which constitutes an analog input terminal of the BOST device 20 and is constituted of, e.g., a multiplexer. Analog output terminals of the DACs 52 provided in the plurality of DUTs 11 are connected to input terminals of the input channel selector 80.

Reference numeral 81 designates a differential input buffer circuit. The differential input buffer circuit 81 comprises a first amplifier 82 connected to an output terminal of the input channel selector 80; a second amplifier 83 connected to a ground terminal; a series element consisting of a first switch 84a and a first resistor 85a, which are connected in series between the first and second amplifiers 82 and 83 with illustrated polarities; and another series element which is connected in parallel with the series element and consists of a second switch 84b and a second resistor 85b, wherein the second switch 84b and the second resistor 85b are connected in series between the first and second amplifiers 82 and 83 with illustrated polarities and wherein the second resistor 85b differs in resistance from the first resistor 85a.

Reference numeral 86 designates a first differential amplifier circuit for differentially amplifying an output from the differential input buffer circuit 81. The first differential amplifier circuit 86 has a third amplifier 87, and an output of the first amplifier 82 and an output of the second amplifier 83 are inputted to the third amplifier 87. Reference numeral 88 designates a second differential amplifier circuit for differentially amplifying an output from the first differential amplifier circuit 86. The second differential amplifier circuit 88 comprises a fourth amplifier 89 whose input terminal is connected to an output terminal of the first differential amplifier circuit 86; a series element consisting of a first analog switch 90a and a first resistor 91a for adjusting a gain of the fourth amplifier 89; a second series element which is connected in parallel with the first series element and consists of a second analog switch 90b and a second resistor 91b, wherein the second analog switch 90b and the second resistor 91b are connected in series and wherein the second resistor 91b differs in resistance from the first resistor 91a; and a third series element which is connected in parallel with the second series element and consists of a third analog switch 90c and a third resistor 91c, wherein the third analog switch 90c and the third resistor 91c are connected in series and wherein the third resistor 91c differs in resistance from the first and second resistors 91a and 91c. An output from the second differential amplifier circuit 88 is input to an ADC 62 of the BOST device 20.

The first and second switches 84a and 84b of the differential input buffer circuit 81 are arranged so as to be able to adjust a gain between the first and second amplifiers 82 and 83 in three steps, by means of closing either or both of the first and second switches 84a and 84b.

In association with the three-step adjustment of gain, the first through third analog switches 90a through 90c are closed, thus switching an input range of the ADC 62. Switching of an input range is activated or deactivated by means of a control signal output from the DSP analysis section 69 in response to outputs from DACs provided on the DUTs 11.

By virtue of the configuration described above, the test apparatus according to the first embodiment can measure DUTs 11 of different types whose DACs 52 are of different analog output voltage levels.

Second Embodiment

Figure 2:
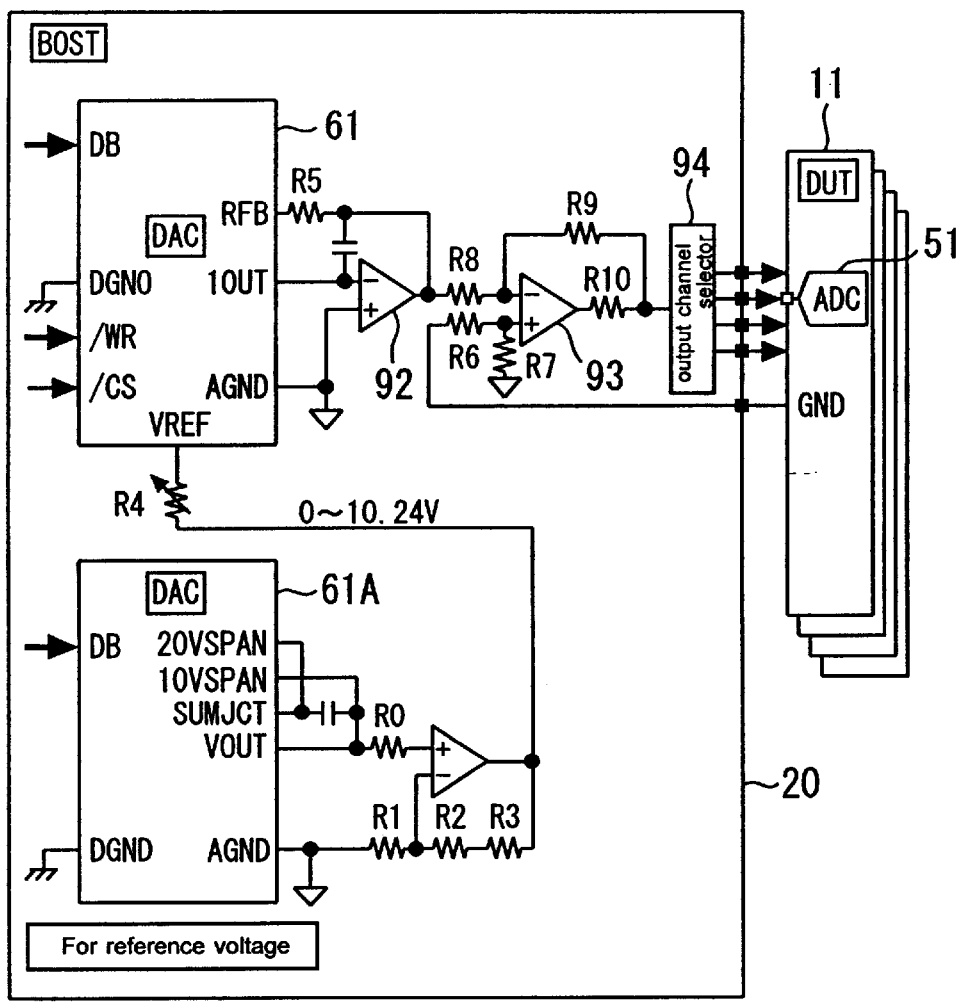
FIG. 2 is a schematic diagram showing the configuration of a test apparatus according to the second embodiment and a test method according to the same.

A second embodiment of the present invention will next be described by reference to a drawing. FIG. 2 is a schematic diagram showing the configuration of a test apparatus according to the second embodiment and a test method according to the same. In other respects, the test apparatus shown in FIG. 2 is identical in configuration with that shown in FIGS. 8 and 9, exclusive of DUTs 11 and a BOST device 20. Hence, these drawings are employed, and repeated explanation of the test apparatus is omitted.

As shown in FIG. 2, reference numeral 61 designates a DAC of the BOST device 20; 92 and 93 each designate an amplifier for amplifying an output from the DAC 61; and 94 designates an output channel selector constituting an analog output terminal of the BOST device 20. The output channel sector 94 is constituted of, for example, a multiplexer. ADCs of the plurality of DUTs 11 can be connected to output terminals of the output channel selector 94.

Reference numeral 61A designates a DAC for generating a reference voltage. An output from the DAC 61A is input to a reference terminal of the DAC 61, thereby adjusting an output voltage range of the DAC 61 in accordance with a reference voltage.

The output from the DAC 61A is controlled by means of adjusting an input to the DAC 61A.

When the DAC 61A produces an output of, e.g., 5.12V, an output of the DAC 61 can be adjusted within a range of 0 through 5.12V. At this time, in the case of resolution of 12 bits, an LSB (least significant bit) assumes a value of 1.25 mV [5.12V/4096 (the twelfth power of 2)].

The DAC 61A produces a maximum output of 10.24V and is adjusted to resolution of 12 bits. When the DAC 61A produces an output of 5.12V, data input to the DAC 61 are represented as 800 in hexadecimal notation.

By virtue of the foregoing configuration the test apparatus according to the second embodiment can measure DUTs 11 of different types whose ADCs 51 are of different analog input voltage levels.

Third Embodiment

A third embodiment of the present invention will now be described by reference to a drawing.

Figure 3:
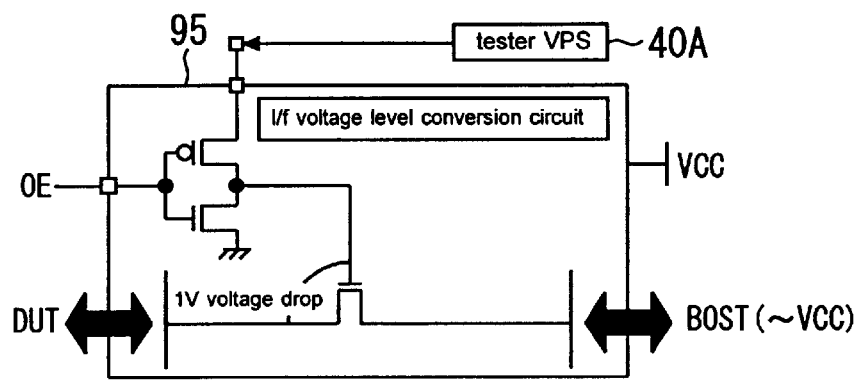
FIG. 3 is a schematic diagram showing the configuration and a test method according to the third embodiment.

FIG. 3 is a schematic diagram showing the configuration and a test method according to the third embodiment. The drawing shows an interface 95 for adjusting a digital signal to be exchanged between the DUTs and the BOST device. In other respects, the test apparatus shown in FIG. 1 is identical in configuration with that shown in FIGS. 8 and 9. Hence, these drawings are employed, and repeated explanation of the test apparatus is omitted.

As shown in FIG. 3, the solid arrow labeled DUT represents a terminal connected to a digital output terminals of ADCs 51 of the DUTs 11 or digital input terminals of the DACs 52 of the DUTs 11. The solid arrow labeled BOST is connected to an input terminal of the BOST for receiving a digital output from the ADCs 51 or an output terminal of the DAC input data circuit 63.

OE designates a control input terminal. The circuit configuration of an interface is well known, and explanation of the circuit configuration is omitted. A programmable power source 40A of the tester 40 is taken as a reference power supply, and an interface level is adjusted by means of adjustment of the reference power supply, thereby switching a range.

By means of such a configuration, measurement of semiconductor integrated circuits (analog circuits) of different types having different digital I/O voltage levels can be effected.

Fourth Embodiment

A fourth embodiment of the present invention will now be described by reference to a drawing.

Figure 4:
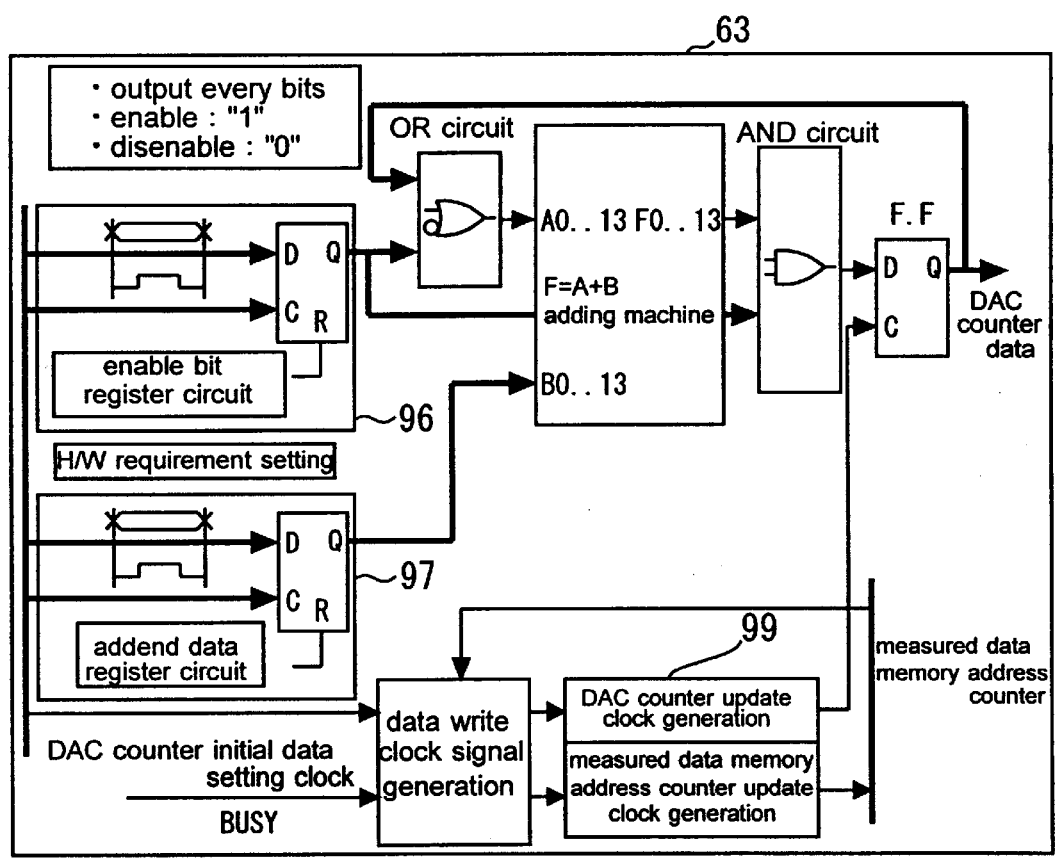
FIG. 4 is a schematic diagram showing the configuration and a test method according to the fourth embodiment.

FIG. 4 is a schematic diagram showing the configuration and a test method according to the fourth embodiment. The drawing shows the configuration of the DAC input data circuit 63 for generating a digital input code to the DACs 52 of the DUTs 11 and to the analog measurement section DAC 61 of the BOST device 20. In other respects, the test apparatus shown in FIG. 4 is identical in configuration with that shown in FIGS. 8 and 9. Hence, these drawings are employed, and repeated explanation of the test apparatus is omitted.

In the present embodiment, the number of digital bits input to the DAC 61 of the BOST device can be changed in accordance with the number of digital bits input to the DACs 52 of the DUTs 11 and the measurement resolution of the ADCs 51 of the DUTs 11.

As shown in FIG. 4, reference numeral 96 designates an enable bit register circuit provided in the DAC input data circuit 63. When the DAC input data circuit (DAC counter) 63 of the BOST device 20 assumes, e.g., a maximum of 14 bits, and the DACs 52 of the DUTs 11 assume a value of ten input bits, the higher four bits of the DAC input data circuit 63 are disenabled, thereby activating the DAC input data circuit 63 as a 10-bit counter.

As mentioned above, the enable bit register circuit disenables higher bits, thereby rendering the DAC input data circuit 63 (DAC counter) variable from 1 to the maximum number of bits. Since the number of digital bits input to the DUTs 11 is variable, the test apparatus can be applied to measurement of analog circuits of different types whose digital signals differ from each other in the number of bits.

Further, the resolution of the DAC 61 of the BOST device 20 can be changed. Hence, a test can be performed with resolution suitable for a test environment (a noise level).

If the level of noise developing in a tester or jig is high and a test cannot be effected with low resolution, the test can be switched to a test with higher resolution. The number of test points can be reduced by elimination of a test with undesired resolution, thereby diminishing a test time.

Figure 5:
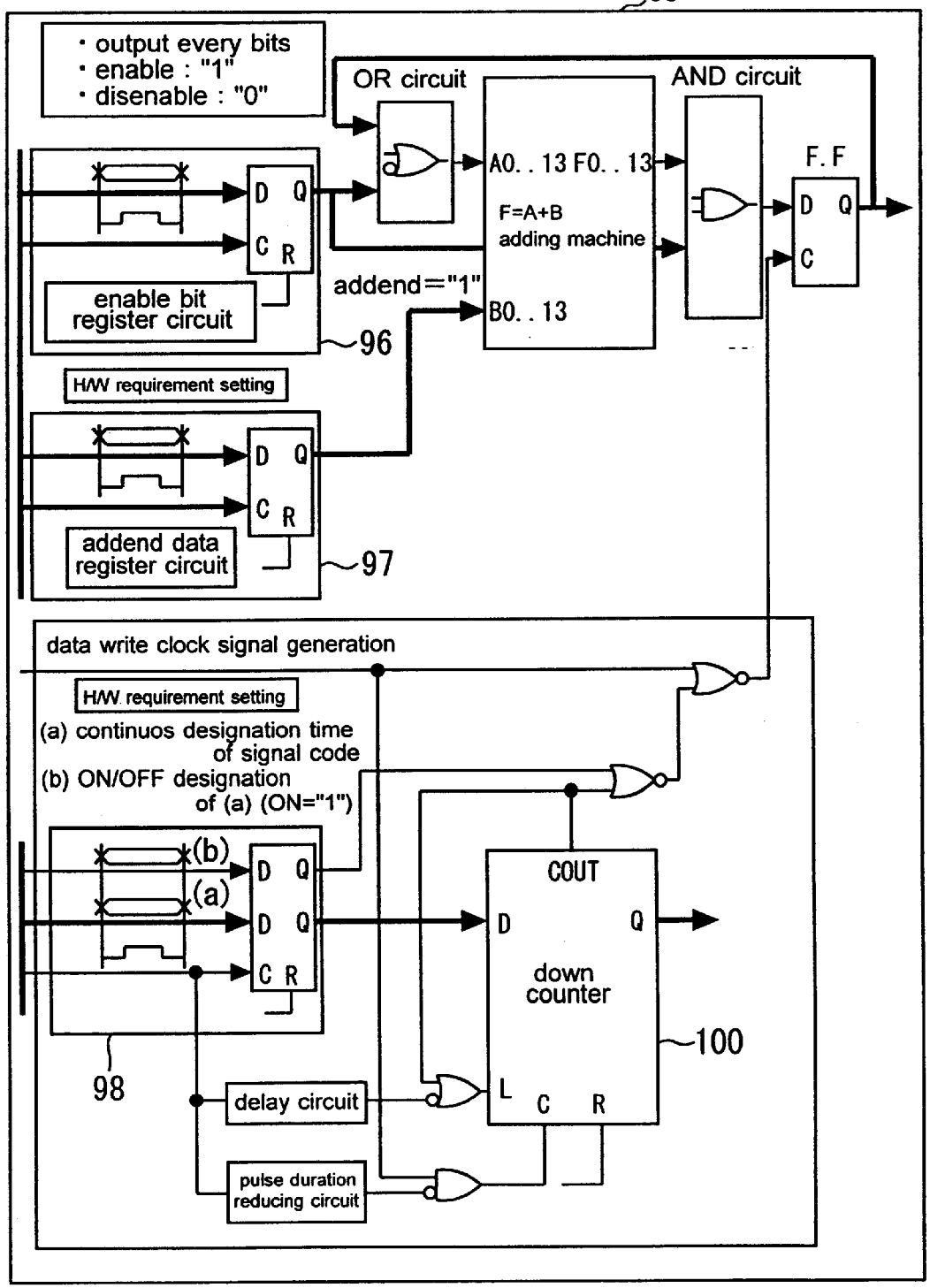
FIG. 5 is a schematic diagram showing the configuration and a test method according to the fifth embodiment.

As indicated by reference numeral 97 shown in FIGS. 4 and 5, if the test apparatus is provided with an addend data register circuit which can retain an addend required at the time of updating a counter (or a subtrahend: an addend=a subtrahend obtained by means of a two's complement of an addend) by i.e., initial data setting. As a result, generation of a variety of DAC input codes becomes possible. FIG. 5 shows the case of an addend of 1.

By means of such a configuration, testing of only a specific code during testing of the DACs 52 of the DUTs 11 is facilitated, thus coping with adaptation to a variety of analog characteristic test methods.

The test apparatus can be applied to measurement of analog circuits of different types.

Fifth Embodiment

A fifth embodiment of the present invention will be described by reference to a drawing.

FIG. 5 is a schematic diagram showing the configuration and a test method according to the fifth embodiment. In the present embodiment, at the time of updating of a code output from the DAC input data circuit (DAC counter) 63, a code identical with that employed previously is output without involvement of an update, and this state is maintained over a plurality of updating operations. For effecting such operations a down counter 100 is provided in a counter controller 98 shown in FIG. 5 and in a DAC counter signal generation section 99 shown in FIG. 4. In contrast with the DAC counter which is updated every time a data write clock signal generation output signal is input, the down counter 100 maintains a previous state without effecting an updating operation until counting is carried out to a count value set by a H/W initial data setting section, through use of a data write clock generation output signal.

As a result, the down counter 100 becomes effective means when an analog output is sampled a plurality of times with use of a single code during a test on the characteristics of the DACs 52 of the DUTs 11, and the samples are averaged. Further, testing of only a specific code during testing of the DACs 52 of the DUTs 11 is facilitated, so that the test apparatus can cope with adaptation to a variety of methods of testing analog characteristics.

Further, the test apparatus can be applied to measurement of analog circuits of different types.

Sixth Embodiment

A sixth embodiment of the present invention will be described by reference to a drawing.

Figure 6:
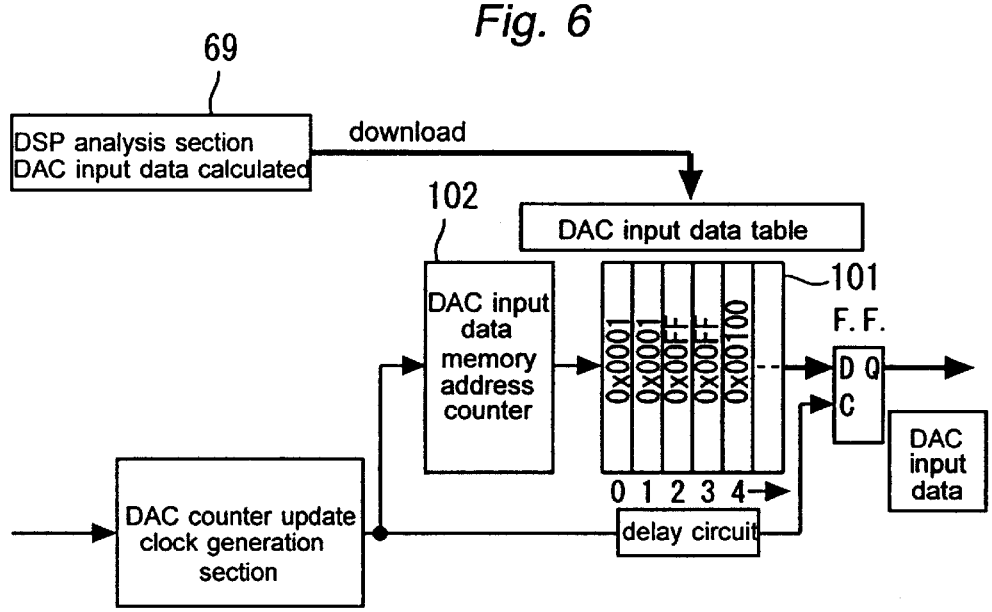
FIG. 6 is a schematic diagram showing the configuration and a test method according to the sixth embodiment of the present invention.

FIG. 6 is a schematic diagram showing the configuration and a test method according to the sixth embodiment of the present invention. As mentioned in connection with the previous embodiments, DAC input data are not generated by a counter, and the DAC input data are calculated by a DSP analysis section 69 beforehand and are stored in lookup memory beforehand, thus constituting a DAC input data table 101. The test apparatus is provided with a memory address counter 102 for supplying an address of the memory. In a real test, a memory address counter 102 is incremented by one in synchronism with a clock signal output from the DAC counter update clock generation section. The DAC input data table 101 outputs DAC input data, thereby sequentially setting the DACs 52.

In the present embodiment, functions equal to those described in the fourth and fifth embodiments can be embodied by means of storing a required number of DAC input data sets into memory in consideration of the number of bits and repetitions required by the DAC 52. Although a memory capacity is increased, random generation of the DAC input data is feasible. Thus, the test apparatus can cope with evaluation of design of an analog circuit of a semiconductor integrated circuit and adaptation to a variety of analog characteristic tests.

Further, the test apparatus can be said to be a kind of tester TPG. Hence, the test apparatus can be readily applied not only to an analog test but also to testing of a logic circuit or a memory circuit. Thus, the test apparatus can be applied to measurement of analog circuits of different types.

Seventh Embodiment

A seventh embodiment of the present invention will be described by reference to a drawing.

Figure 7:
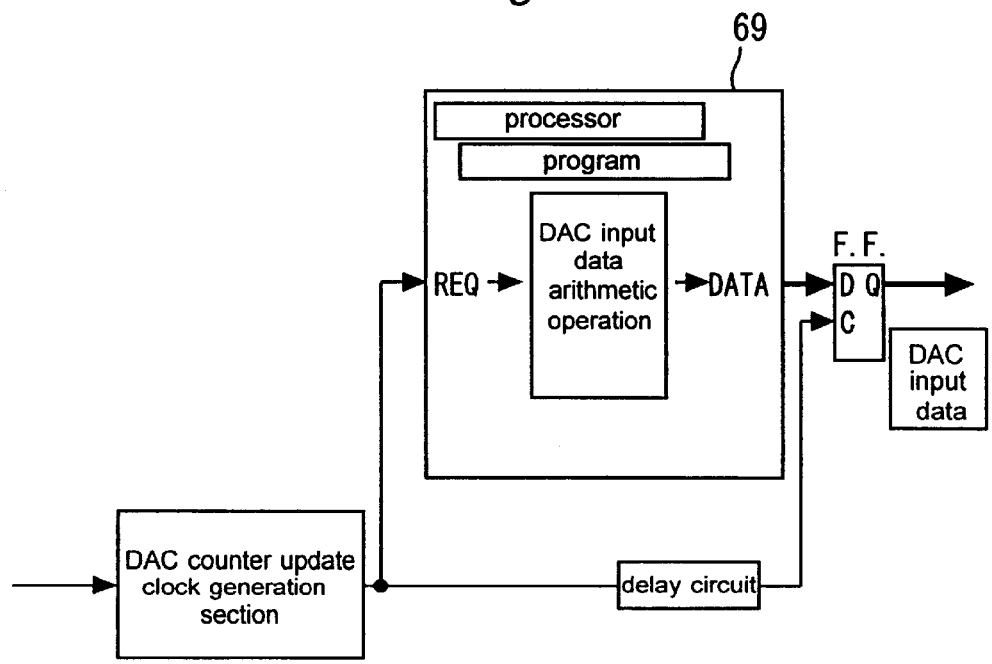
FIG. 7 is a schematic diagram showing the configuration and a test method according to the seventh embodiment of the present invention.

FIG. 7 is a schematic diagram showing the configuration and a test method according to the seventh embodiment of the present invention. In the present embodiment, DAC input data are generated by utilization of arithmetic operation function of a processor, such as the DSP analysis section 69.

More specifically, an update clock signal to be input to a DAC counter is taken as a request signal, and a code to be input to the analog measurement section DAC 61 of the BOST device 20 is produced by a processor of the DSP analysis section 69.

The present embodiment yields an advantage of ability to take the DSP analysis section 69 of the BOST device 20 as an analysis device and as a DAC input data generator. Thus, a program of the processor can produce DAC input data, in consideration of the number of bits and repetitions required by the DACs 52. Thus, functions equal to those described in connection with the fourth through sixth embodiments can be implemented. The test apparatus can handle evaluation of design of an analog circuit of a semiconductor integrated circuit as well as adaptation to a variety of analog characteristic tests.

The test apparatus can be said to be a kind of tester TPG. Hence, the test apparatus can be readily applied not only to an analog test but also to testing of a logic circuit or a memory circuit. Thus, the test apparatus can be applied to measurement of analog circuits of different types.

Beside the claimed invention, the present invention includes various aspects as described above and summarized as follows.

According to one aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and an external controller connected to the test ancillary device. The test ancillary device comprises a data circuit which produces a digital test signal and supplies the digital test signal to the D/A converter circuit of the semiconductor integrated circuit to be tested, a testing D/A converter circuit which converts the digital test signal output from the data circuit into an analog test signal and supplies the analog test signal to the A/D converter circuit of the semiconductor integrated circuit to be tested, an input range switching circuit which switches an input range in accordance with the level of an analog test signal output from the D/A converter circuit of the semiconductor integrated circuit to be tested, an testing A/D converter circuit which converts an output from the input range switching circuit into a digital test output, measured data memory for storing a digital test output from the A/D converter circuit of the semiconductor integrated circuit to be tested and the digital test output from the testing A/D converter circuit, and an analysis section for analyzing the each digital test outputs stored in the measured data memory. The digital test signal and the analog test signal are imparted to the semiconductor integrated circuit to be tested in accordance with an instruction from the external controller, and a result of analysis of the each digital test outputs stored in the measured data memory, the analysis being performed by the analysis section, is sent to the external controller.

According to another aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and an external controller connected to the test ancillary device. The test ancillary device comprises a data circuit which produces a digital test signal and supplies the digital test signal to the D/A converter circuit of the semiconductor integrated circuit to be tested, a testing D/A converter circuit which converts the digital test signal output from the data circuit into an analog test signal, an output range switching circuit which switches a range of level of an output from the testing D/A converter circuit and can supply the output level to the A/D converter circuit of the semiconductor integrated circuit to be tested, a testing A/D converter circuit which converts an analog test output from the D/A converter circuit of the semiconductor integrated circuit to be tested into a digital test output, measured data memory for storing a digital test output from the A/D converter circuit of the semiconductor integrated circuit to be tested and the digital test output from the testing A/D converter circuit, and an analysis section for analyzing the each digital test outputs stored in the measured data memory. The digital test signal and the analog test signal are imparted to the semiconductor integrated circuit to be tested in accordance with an instruction from the external controller, and a result of analysis of the each digital test outputs stored in the measured data memory, the analysis being performed by the analysis section, is sent to the external controller.

According to another aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, an external controller connected to the test ancillary device, and a voltage converter for matching, on the basis of a reference voltage supplied from a programmable power source of the external controller, an I/O level of a digital signal of the semiconductor integrated circuit to be tested to an I/O level of a digital signal of the test ancillary device. The test ancillary device comprises a data circuit which produces a digital test signal and supplies the digital test signal to the D/A converter circuit of the semiconductor integrated circuit to be tested by way of the voltage converter, a testing D/A converter circuit which converts the digital test signal output from the data circuit into an analog test signal and supplies the analog test signal to the A/D converter circuit of the semiconductor integrated circuit to be tested, a testing A/D converter circuit which converts an analog test output from the D/A converter circuit of the semiconductor integrated circuit to be tested into a digital test output, measured data memory for storing a digital test output from the A/D converter circuit of the semiconductor integrated circuit to be tested by way of the voltage converter and a digital test output from the testing A/D converter circuit for test purpose, and an analysis section for analyzing the each digital test outputs stored in the measured data memory. The digital test signal and the analog test signal are imparted to the semiconductor integrated circuit to be tested in accordance with an instruction from the external controller, and a result of analysis of the digital test outputs stored in the measured data memory, the analysis being performed by the analysis section, is sent to the external controller.

According to one aspect of the present invention, a method of testing a semiconductor integrated circuit through use of the test apparatus for testing a semiconductor integrated circuit as described above.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-32851, filed on Feb. 8, 2001 including specification, claims, drawings and summary, on which the Convention priority of the present application is based, are incorporated herein by reference in its entirety.

What is claimed is:

1. An apparatus for testing a semiconductor integrated circuit comprising:
   a test circuit board configured to transmit signals to and receive signals from a semiconductor integrated circuit to be tested, said semiconductor integrated circuit comprising an A/D converter circuit to convert analog signals to digital signals and a D/A converter circuit to convert digital signals to analog signals;
   a test ancillary device which is disposed in the vicinity of said test circuit board and is connected to said test circuit board; and
   an external controller connected to said test ancillary device, wherein said test ancillary device comprises:
      a data circuit which produces a digital test signal and supplies said digital test signal to said D/A converter circuit of said semiconductor integrated circuit to be tested;
      a testing D/A converter circuit which converts the digital test signal from said data circuit into an analog test signal and supplies said analog test signal to said A/D converter circuit of said semiconductor integrated circuit to be tested;
      a register circuit which is provided in said data circuit and is arranged so as to be able to change the number of bits of digital input of said D/A converter circuit of said semiconductor integrated circuit to be tested and the number of bits of digital input of said testing D/A converter circuit matching the measurement resolution of said A/D converter circuit of said semiconductor integrated circuit to be tested;
      a testing A/D converter circuit which converts an analog test output from said D/A converter circuit of said semiconductor integrated circuit to be tested into a digital test output;
      measured data memory for storing a digital test output from said A/D converter circuit of said semiconductor integrated circuit to be tested and said digital test output from said testing A/D converter circuit; and
      an analysis section for analyzing said each digital test outputs stored in said measured data memory; and
      wherein said digital test signal and said analog test signal are imparted to said semiconductor integrated circuit to be tested in accordance with an instruction from said external controller, and a result of analysis of said each digital test outputs stored in said measured data memory, the analysis being performed by said analysis section, is sent to said external controller.

2. The apparatus according to claim 1, wherein said external controller is a tester.

3. The apparatus according to claim 1, wherein said register circuit is provided with a data register circuit capable of changing an addend or subtrahend at the time of updating of a counter for a digital code.

4. The apparatus according to claim 1, wherein said register circuit is provided with a counter controller which outputs a code identical with that output in a previous operation when a counter for a digital code is updated and which retains the state for a period of time corresponding to a plurality of updating operations.

5. An apparatus for testing a semiconductor integrated circuit comprising:

a test circuit board configured to transmit signals to and receive signals from a semiconductor integrated circuit to be tested, said semiconductor integrated circuit comprising an A/D converter circuit to convert analog signals to digital signals and a D/A converter circuit to convert digital signals to analog signals;

a test ancillary device which is disposed in the vicinity of said test circuit board and is connected to said test circuit board; and a tester connected to said test ancillary device, wherein said test ancillary device comprises:

look-up memory which stores required data beforehand, outputs data by sequentially updating an output from a memory address counter for supplying an address of said required data, and supplies the data as a digital test signal to said D/A converter circuit of said semiconductor integrated circuit to be tested;

a testing D/A converter circuit which converts the digital test signal output from said look-up memory into an analog test signal and supplies said analog test signal to said A/D converter circuit of said semiconductor integrated circuit to be tested;

a testing A/D converter circuit which converts an analog test output from said D/A converter circuit of said semiconductor integrated circuit to be tested into a digital test output;

measured data memory for storing a digital test output from said A/D converter circuit of said semiconductor integrated circuit to be tested and said digital test output from said testing A/D converter circuit; and an analysis section for analyzing said each digital test outputs stored in said measured data memory; and wherein said digital test signal and said analog test signal are imparted to said semiconductor integrated circuit to be tested in accordance with an instruction from said tester, and a result of analysis of said each digital test outputs stored in said measured data memory, the analysis being performed by said analysis section, is sent to said tester.

6. An apparatus for testing a semiconductor integrated circuit comprising:

a test circuit board configured to transmit signals to and receive signals from a semiconductor integrated circuit to be tested, said semiconductor integrated circuit comprising an A/D converter circuit to convert analog signals to digital signals and a D/A converter circuit to convert digital signals to analog signals;

a test ancillary device which is disposed in the vicinity of said test circuit board and is connected to said test circuit board; and a tester connected to said test ancillary device, wherein said test ancillary device comprises:

an analysis section which produces a digital test signal by an arithmetic function and supplies said digital test signal to said D/A converter circuit of the semiconductor integrated circuit to be tested;

a testing D/A converter circuit which converts said digital test signal output from said analysis section into an analog test signal and supplies said analog test signal to said A/D converter circuit of said semiconductor integrated circuit to be tested;

a testing A/D converter circuit which converts an analog test output from said D/A converter circuit of said semiconductor integrated circuit to be tested into a digital test output; and measured data memory for storing a digital test output from said A/D converter circuit of said semiconductor integrated circuit to be tested and a digital test output from said testing A/D converter circuit; and wherein said analysis section analyzes said each digital test outputs stored in said measured data memory.

7. A method for testing a semiconductor integrated circuit including a step of testing a semiconductor integrated circuit through use of a test apparatus selected from the group of the test apparatuses according to claim 1, 5 or 6.

* * * * *